(12) United States Patent
Park et al.

(10) Patent No.: US 10,943,971 B2
(45) Date of Patent: Mar. 9, 2021

(54) DISPLAY DEVICE

(71) Applicant: SAMSUNG DISPLAY CO., LTD., Yongin-si (KR)

(72) Inventors: Soon Sung Park, Asan-si (KR); Jeong Jin Kim, Cheonan-si (KR); Seong Sik Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/779,543

(22) Filed: Jan. 31, 2020

(65) Prior Publication Data

US 2020/0176543 A1 Jun. 4, 2020

Related U.S. Application Data

(63) Continuation of application No. 15/848,611, filed on Dec. 20, 2017, now Pat. No. 10,553,664.

(30) Foreign Application Priority Data

Jul. 14, 2017 (KR) .......................... 10-2017-0089891

(51) Int. Cl.
*H01L 27/32* (2006.01)
*G06F 3/044* (2006.01)
(Continued)

(52) U.S. Cl.
CPC ...... *H01L 27/3276* (2013.01); *G02F 1/13338* (2013.01); *G02F 1/13452* (2013.01);
(Continued)

(58) Field of Classification Search
CPC ...... H05K 1/147; H05K 1/117; H05K 5/0017; H01L 27/323; H01L 27/3276;
(Continued)

(56) References Cited

U.S. PATENT DOCUMENTS

| 7,557,451 B2 * | 7/2009 | Shinojima ........... G02F 1/13452 174/260 |
| 2002/0054261 A1 | 5/2002 | Sekiguchi |

(Continued)

FOREIGN PATENT DOCUMENTS

| KR | 10-2016-0036716 A | 4/2016 |
| KR | 10-2016-0061563 A | 6/2016 |
| KR | 10-2016-0106829 A | 9/2016 |

OTHER PUBLICATIONS

EPO Extended Search Report dated Aug. 3, 2018, for corresponding European Patent Application No. 18167447.4 (14 pages).

*Primary Examiner* — Roshn K Varghese
(74) *Attorney, Agent, or Firm* — Lewis Roca Rothgerber Christie LLP

(57) ABSTRACT

A display device includes a first panel including a pad side area at one side of the first panel, a first optically transparent adhesive member on one surface of the first panel, a printed circuit board including a first attachment portion attached to the one surface of the first panel at the pad side area, a window on the first optically transparent adhesive member, a second optically transparent adhesive member on the other surface of the first panel, and a second panel on the second optically transparent adhesive member opposite the first panel, wherein the pad side area has a connection area at which the printed circuit board is attached to the first panel, and at which an edge of the first optically transparent adhesive member extends beyond an edge of the second optically transparent adhesive member, and a non-connection area at which the printed circuit board is not attached.

19 Claims, 12 Drawing Sheets

(51) Int. Cl.
*H01L 51/52* (2006.01)
*G02F 1/1345* (2006.01)
*G02F 1/1333* (2006.01)
*G06F 3/041* (2006.01)
*H05K 1/11* (2006.01)
*H05K 1/14* (2006.01)
*H05K 5/00* (2006.01)

(52) U.S. Cl.
CPC .......... *G06F 3/0443* (2019.05); *G06F 3/0446* (2019.05); *G06F 3/04164* (2019.05); *H01L 51/5246* (2013.01); *H05K 1/117* (2013.01); *H05K 1/147* (2013.01); *H05K 5/0017* (2013.01); *G02F 2202/28* (2013.01); *H01L 27/323* (2013.01); *H05K 2201/042* (2013.01); *H05K 2201/049* (2013.01); *H05K 2201/052* (2013.01); *H05K 2201/056* (2013.01); *H05K 2201/10128* (2013.01); *H05K 2201/10151* (2013.01)

(58) Field of Classification Search
CPC ............. H01L 51/5246; G02F 2202/28; G02F 1/13338; G02F 1/13452; G06F 3/044
See application file for complete search history.

(56) References Cited

U.S. PATENT DOCUMENTS

| | | |
|---|---|---|
| 2009/0185339 A1 | 7/2009 | Kwon et al. |
| 2009/0322983 A1 | 12/2009 | Hashino |
| 2010/0085320 A1 | 4/2010 | Kuwajima et al. |
| 2010/0245706 A1 | 9/2010 | Oohira |
| 2013/0147742 A1 | 6/2013 | Lee |
| 2014/0097408 A1 | 4/2014 | Kim et al. |
| 2016/0147361 A1 | 5/2016 | Ahn |
| 2017/0031522 A1* | 2/2017 | Hong .................... G06F 3/0416 |
| 2017/0047547 A1 | 2/2017 | Son et al. |
| 2017/0064845 A1 | 3/2017 | Jung et al. |

* cited by examiner

DISPLAY DEVICE

CROSS-REFERENCE TO RELATED APPLICATION

This application is a continuation of U.S. patent application Ser. No. 15/848,611, filed Dec. 20, 2017, which claims priority to and the benefit of Korean Patent Application No. 10-2017-0089891, filed Jul. 14, 2017, the entire content of both of which is incorporated herein by reference.

BACKGROUND

1. Field

The present disclosure relates to a display device including a plurality of adhesion members and an adhesive member for bonding them.

2. Description of the Related Art

A display device is a device for displaying an image, and includes a display panel, such as an organic light-emitting display panel or a liquid crystal display panel. The display device may include a window for protecting the display panel from an external impact. In particular, the window is widely applied to portable electronic devices, such as smart phones. Some portable electronic devices have a touch input function. Such a display device may include a touch panel that performs a touch input function. The above-described window, touch panel, and display panel may be attached to each other through an adhesive. If there is a stepped space at an end portion between the window, the touch panel, and the display panel that are attached to each other, the display device may be vulnerable to an external impact, and it may further be difficult to achieve and maintain flatness of the display device.

SUMMARY

Aspects of the present disclosure provide a display device with improved flatness.

An embodiment may be related a display device. The display device includes a first panel including a pad side area at one side of the first panel, a first optically transparent adhesive member on one surface of the first panel, a printed circuit board including a first attachment portion attached to the one surface of the first panel at the pad side area, a window on the first optically transparent adhesive member, a second optically transparent adhesive member on the other surface of the first panel, and a second panel on the second optically transparent adhesive member opposite the first panel, wherein the pad side area has a connection area at which the printed circuit board is attached to the first panel, and at which an edge of the first optically transparent adhesive member extends beyond an edge of the second optically transparent adhesive member in a plan view, and a non-connection area at which the printed circuit board is not attached to the first panel.

The first optically transparent adhesive member partially may cover the printed circuit board at the connection area.

The second optically transparent adhesive member might not overlap the first attachment portion of the printed circuit board at the connection area.

The first panel and the second panel may be separated from each other by an empty space at the connection area.

The edge of the first optically transparent adhesive member at the connection area may protrude outwardly further than the edge of the first optically transparent adhesive member at the non-connection area.

The edge of the second optically transparent adhesive member at the connection area may be more concavely recessed than the edge of the second optically transparent adhesive member at the non-connection area.

The connection area of the pad side area may protrude more outwardly than the non-connection area.

The first optically transparent adhesive member may have a modulus that is smaller than that of the second optically transparent adhesive member.

The edge of the first optically transparent adhesive member and the edge of the second optically transparent adhesive member may be aligned with each other at the non-connection area.

The edge of the second optically transparent adhesive member may extend further than the edge of the first optically transparent adhesive member at the non-connection area.

The connection area may include a plurality of separate portions, and each of the separate portions of the connection area may be between adjacent portions of the non-connection area.

The printed circuit board may further include a second attachment portion that is attached to the other surface of the first panel at the pad side area, and the second optically transparent adhesive member might not overlap the second attachment portion.

An embodiment may be related a display device. The display device includes a touch panel including a sensing unit, and having a pad side area on one side of the sensing unit, a first optically transparent adhesive member on one surface of the touch panel, a touch printed circuit board including a first attachment portion attached to the one surface of the touch panel at the pad side area, a window on the first optically transparent adhesive member, a second optically transparent adhesive member on the other surface of the touch panel, and a display panel on the second optically transparent adhesive member opposite the touch panel, wherein the pad side area includes a connection area at which the touch printed circuit board is attached to the touch panel, at which the first optically transparent adhesive member partially covers the touch printed circuit board, at which the second optically transparent adhesive member does not overlap the first attachment portion of the touch printed circuit board, and at which and an edge of the first optically transparent adhesive member extends further than an edge of the second optically transparent adhesive member, and a non-connection area at which the touch printed circuit board is not attached to the touch panel.

The touch panel and the display panel may be separated from each other by an empty space at the connection area, and the edge of the first optically transparent adhesive member and the edge of the second optically transparent adhesive member may be aligned with each other at the non-connection area.

The display panel may include a display unit, and a driving unit at one side of the display unit, wherein the sensing unit overlaps the display unit, and wherein the pad side area overlaps the driving unit.

The display device may further include a display printed circuit board attached to the driving unit of the display panel, a main circuit board to which the touch printed circuit board and the display printed circuit board are electrically connected, and a panel lower sheet attached to a back surface of the display unit of the display panel.

The display panel may include a flexible substrate that is bent in a direction opposite to a display surface at the driving unit.

The touch printed circuit board may further include a second attachment portion attached to the other surface of the touch panel at the pad side area, and the second optically transparent adhesive member might not overlap the second attachment portion.

An embodiment may be related a display device. The display device includes a touch panel a touch printed circuit board attached to one surface of the touch panel, a first optically transparent adhesive member on the one surface of the touch panel, and a second optically transparent adhesive member on the other surface of the touch panel, wherein each of the touch panel, the first optically transparent adhesive member, and the second optically transparent adhesive member includes a side area in one direction, wherein the touch panel includes a first protrusion at the side area, wherein the touch printed circuit board is attached at the first protrusion, wherein the first optically transparent adhesive member includes a second protrusion at the side area that partially overlaps the first protrusion in a plan view, wherein the first optically transparent adhesive member covers at least a part of the touch printed circuit board, and wherein a edge of the second protrusion of the first optically transparent adhesive member protrudes more outwardly than a edge of the side area of the second optically transparent adhesive member.

The side area of the touch panel may include a connection area at which the touch printed circuit board is attached and including the first protrusion, and a non-connection area at which the touch printed circuit board is not attached to the touch panel, wherein the edge of the second optically transparent adhesive member at the connection area is recessed more concavely than the edge of the second optically transparent adhesive member at the non-connection area.

According to the display device of an embodiment, the first optically transparent adhesive member protruding convexly on the connection area may cover the attachment portion of the touch printed circuit board to fill a space between the touch printed circuit board and the window. Accordingly, it is possible to prevent or reduce the likelihood of the attachment portion of the touch printed circuit board coming off, to protect the display device from an external impact by reducing or eliminating a separation space between the window and the touch printed circuit board, and to improve the flatness of the display device by suppressing the movement of the window and the touch printed circuit board.

Further, because the second optically transparent adhesive member that is concavely recessed on the connection area exposes the other surface of the touch panel, a space suitable for an attachment process of the touch printed circuit board can be secured. Also, even if an external force is received or wrinkles are generated by the attachment portion of the touch printed circuit board, it is possible to reduce or prevent the external force or wrinkles from being transmitted to the display panel located therebelow.

The effects of the present disclosure are not limited to the above-described effects, and other effects which are not described herein will become apparent to those skilled in the art from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
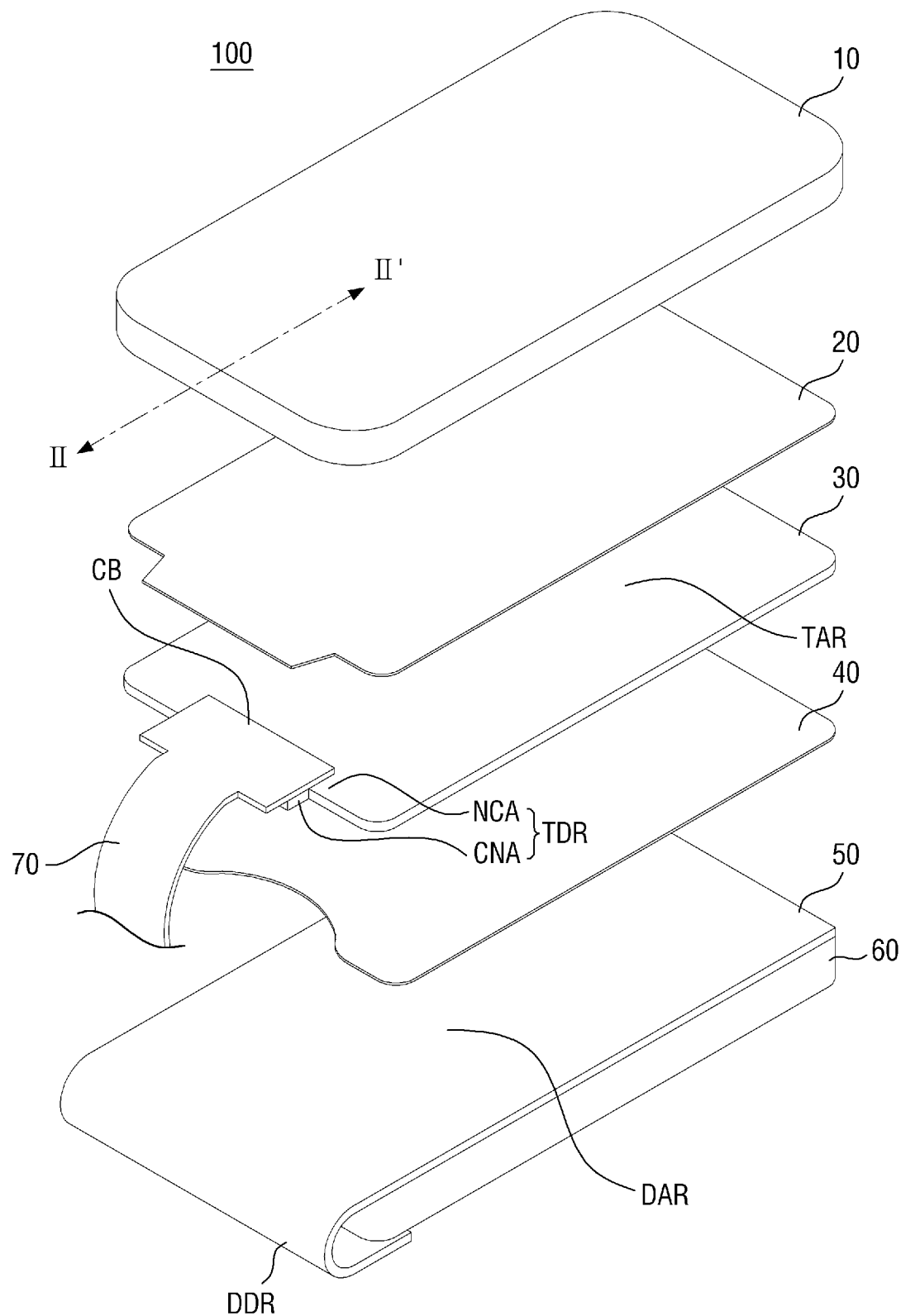
FIG. 1 is an exploded perspective view of a display device according to an embodiment.

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A display device according to an embodiment includes a plurality of adhesion members, and an adhesive member for bonding the adhesion members. The plurality of adhesion members may include a panel and/or a window. The panel may include a display panel, a touch panel and the like. The adhesive member may be optically transparent.

Figure 2:
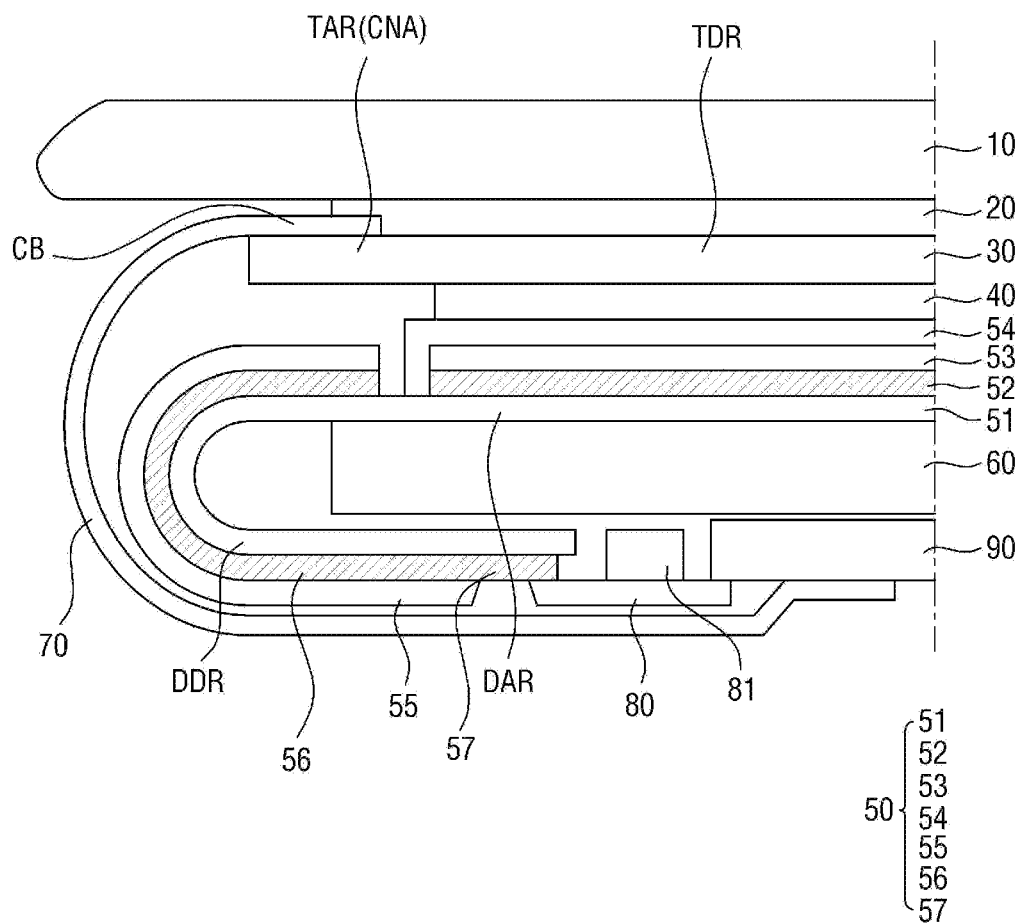
FIG. 2 is a cross-sectional view taken along the line II-II' of FIG. 1.
Figure 3:
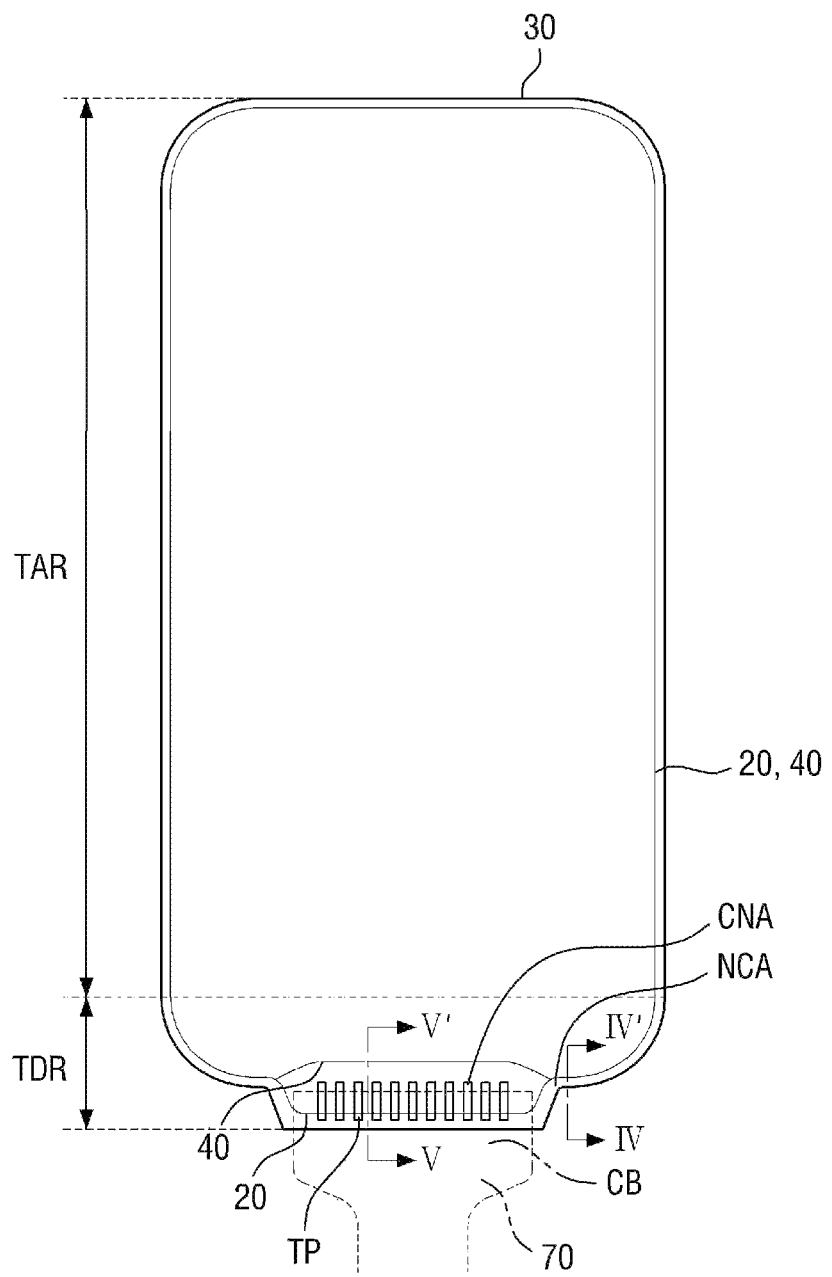
FIG. 3 is a layout diagram showing a planar arrangement relationship between a touch panel and first and second optically transparent adhesive members.
Figure 4:
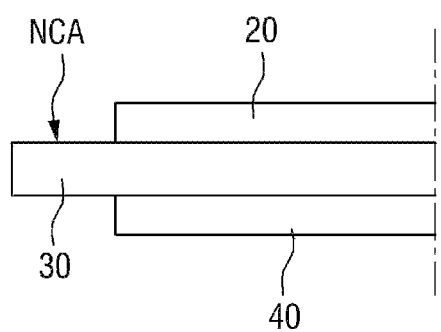
FIG. 4 is a cross-sectional view taken along the line IV-IV' of FIG. 3.
Figure 5:
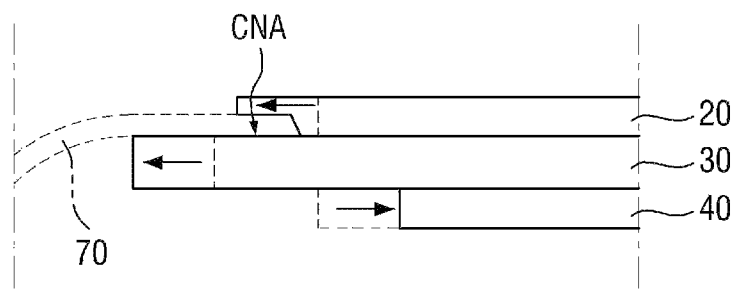
FIG. 5 is a cross-sectional view taken along the line V-V of FIG. 3.

FIG. 1 is an exploded perspective view of a display device according to an embodiment. FIG. 2 is a cross-sectional view taken along the line II-II' of FIG. 1. FIG. 3 is a layout diagram showing a planar arrangement relationship between a touch panel and first and second optically transparent adhesive members. FIG. 4 is a cross-sectional view taken along the line IV-IV' of FIG. 3. FIG. 5 is a cross-sectional view taken along the line V-V of FIG. 3.

Referring to FIGS. 1 to 5, a display device 100 includes a display panel 50, a touch panel 30, a window 10, a first optically transparent adhesive member 20, and a second optically transparent adhesive member 40.

The display panel 50 is a panel for displaying an image by an input data signal. A panel such as an organic light-emitting display panel, a liquid crystal display panel, a plasma display panel, and an electrophoretic display panel may be used as the display panel 50. In the illustrated embodiment, an organic light-emitting display panel is used as the display panel 50.

The display panel 50 may include a display unit DAR and a driving unit DDR.

The display unit DAR includes a plurality of pixels. Each pixel may include a light-emitting layer 53, and a circuit layer 52 for controlling the amount of light emitted from the light-emitting layer 53. The circuit layer 52 may include a display wiring, a display electrode, and at least one transistor. The light-emitting layer 53 may include an organic light-emitting material. The light-emitting layer 53 may be sealed by a sealing film 54. The sealing film 54 may seal the light-emitting layer 53 to reduce or prevent moisture and the like from being introduced into the sealing film 54 from the outside. The sealing film 54 may be a single or multilayer film of an inorganic film, or may be a laminated film in which an inorganic film and an organic film are alternately laminated.

The display unit DAR may have a rectangular shape, or may have a rectangular shape with rounded corners. However, the present disclosure is not limited thereto, and the display unit DAR may have various shapes, such as a square, other polygons, a circle, an ellipse, or the like.

The driving unit DDR is in the periphery of the display unit DAR, for example, on one side of the display unit DAR. The driving unit DDR may be a non-display unit that does not display an image. Unlike the display unit DAR, the driving unit DDR may include no pixels. When the display unit DAR has a rectangular shape with rounded corners, the driving unit DDR is adjacent to at least one side of the rectangular shape of the display unit DAR. In the figure, it is illustrated that the driving unit DDR is adjacent to one end side of the display unit DAR. The driving unit DDR may include a driving wiring 56 connected to the display wiring of the pixel and a driving wiring pad 57 of the driving wiring 56. An external component, such as a driving chip or a printed circuit board, may be mounted on the driving wiring pad 57, as will be described later.

In one embodiment, the display panel 50 may include a flexible substrate 51. The substrate 51 may be formed to include, for example, a flexible plastic material such as polyimide. The circuit layer 52 and the light-emitting layer 53 of the display unit DAR may be on one surface of the substrate 51. When the substrate 51 has flexible characteristics, the substrate 51 may be bent at the driving unit DDR. For example, the substrate 51 of the driving unit DDR adjacent to the short side of the display unit DAR may be bent in a direction opposite to the display surface, and may extend toward the back surface of the display unit DAR. The bent driving unit DDR may partially overlap the display unit DAR. One surface of the substrate 51 in an overlapping area and one surface of the substrate 51 of the display unit DAR may be oriented in opposite directions. That is, one surface of the substrate 51 of the display unit DAR may face upward, while one surface of the bent substrate 51 in the overlapping area may face downward.

The driving wiring 56 of the driving unit DDR may extend along the bending area, and the driving wiring pad 57 may be at the overlapping area of the display unit DAR and the bent driving unit DDR.

The driving unit DDR of the display panel 50 may include a protective film 55. The protective film 55 covers and protects the driving wiring 56. Furthermore, the protective film 55 may serve to enhance the rigidity of the flexible substrate 51, or to alleviate stress in the bending area. The protective film 55 exposes a portion of the driving wiring pad 57.

In one embodiment, the protective film 55 may include an organic coating layer, such as polyimide, acrylate, epoxy and the like. In another embodiment, the protective film 55 may be attached in the form of a protective film.

The driving wiring pad 57 of the driving unit DDR of the display panel 50 may be electrically connected to a display printed circuit board 80. For example, the driving wiring pad 57 may be on one surface of the substrate 51, and the display printed circuit board 80 may be mounted on the driving wiring pad 57 through an anisotropic conductive film (ACF) or the like. The display printed circuit board 80 may be a film type flexible printed circuit board. A driving chip may be mounted on the display printed circuit board 80. The display printed circuit board 80 may be formed of a chip on film, a tape carrier package, or the like.

The display printed circuit board 80 may be electrically connected to a main circuit board 90. The main circuit board 90 may be a rigid printed circuit board. The main circuit board 90 and the display printed circuit board 80 may be attached to each other via an anisotropic conductive film (ACF) or the like.

The touch panel 30 is on the top of the display panel 50. The touch panel 30 may acquire position information of an input point by, for example, a capacitive method, a resistive method, an electromagnetic induction method, an infrared method, or the like. In this embodiment, a capacitive touch panel 30 is exemplified, but the present disclosure is not limited thereto.

The touch panel 30 may overlap the display unit DAR of the display panel 50, and may partially overlap the driving unit DDR. The touch panel 30 might not overlap a portion where the substrate 51 of the display panel 50 begins to be bent.

The touch panel 30 may include a touch electrode and/or a touch wiring. The touch panel 30 will be described in detail with reference to FIGS. 6 and 7.

Figure 6:
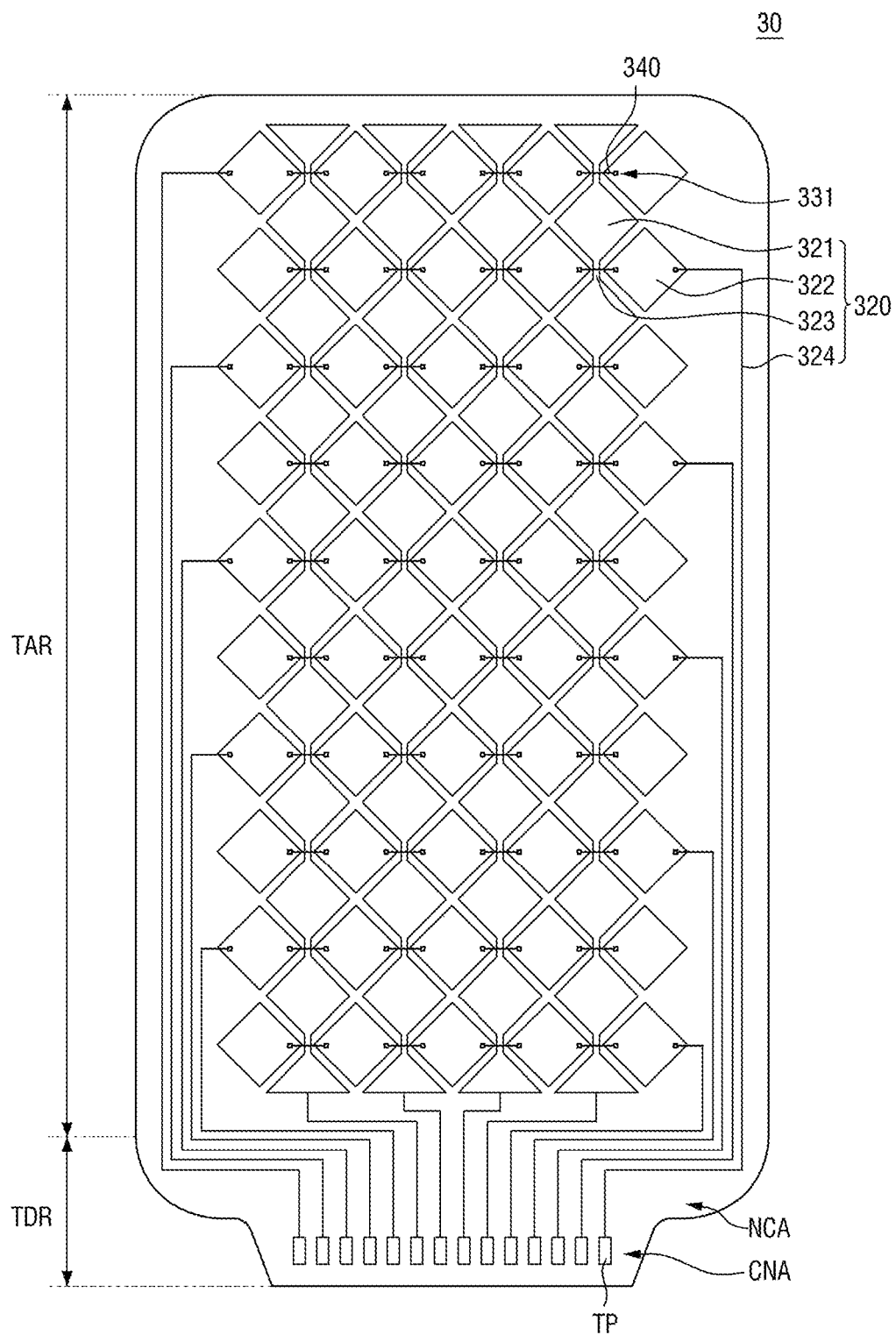
FIG. 6 is a plan layout diagram of a touch panel according to an embodiment.
Figure 7:
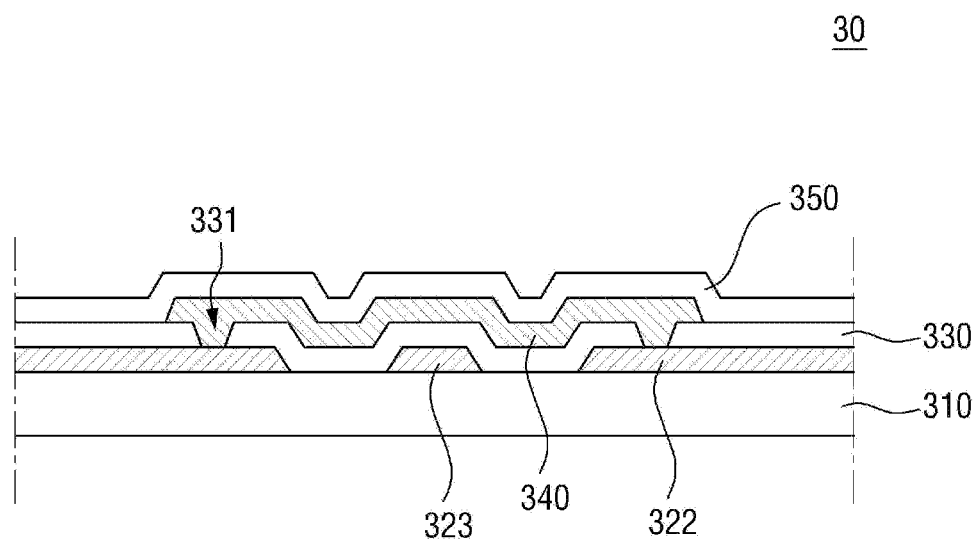
FIG. 7 is a cross-sectional view of a touch panel according to an embodiment.

FIG. 6 is a plan layout diagram of a touch panel according to an embodiment. FIG. 7 is a cross-sectional view of a touch panel according to an embodiment.

Referring to FIGS. 6 and 7, the touch panel 30 includes a sensing unit TAR and a pad side area TDR. When the touch panel 30 has a rectangular shape in plan view, the touch panel 30 may include four side portions adjacent to the respective sides. The pad side area TDR may be located on one side adjacent to one end side of the touch panel 30 in plan view. The pad side area TDR may be on one side with respect to the sensing unit TAR. The sensing unit TAR of the touch panel 30 may be located to overlap the display unit DAR of the display panel 50. The pad side area TDR of the touch panel 30 is located to overlap the driving unit DDR of the display panel 50.

The sensing unit TAR of the touch panel 30 includes a substrate 310, a first wiring layer 320 on one surface of the substrate 310, a first insulating layer 330 on the first wiring layer 320, a second wiring layer 340 on the first insulating layer 330, and a second insulating layer 350 on the second wiring layer 340.

The substrate 310 may be made of glass or plastic such as polyethylene terephthalate (PET), polyimide (PI), polycarbonate (PC), polyethylene (PE), polypropylene (PP), polysulfone (PSF), polymethylmethacrylate (PMMA), triacetylcellulose (TAC), and/or cycloolefin polymer (COP).

The first wiring layer 320 is on one surface of the substrate 310. The first wiring layer 320 includes a plurality of first touch electrodes 321 and a plurality of second touch electrodes 322. The first touch electrodes 321 and the second touch electrodes 322 may acquire position information of a point touched by a self-capacitance method and/or a mutual capacitance method.

The first touch electrodes 321 and the second touch electrodes 322 may be arranged in a matrix. The first touch electrodes 321 and the second touch electrodes 322 may be rhombic, but are not limited thereto. The first touch electrodes 321 may be electrically connected along a column direction (long side direction), and the second touch electrodes 322 may be electrically connected along a row direction (short side direction). However, the present disclosure is not limited thereto, and the first touch electrodes 321 may be electrically connected along the row direction and the second touch electrodes 322 may be electrically connected along the column direction. The first touch electrodes 321 and the second touch electrodes 322 are insulated from each other, and are separated from each other.

The first wiring layer 320 includes a first connection wiring 323 connecting the first touch electrodes 321. Respective ones of the first touch electrodes 321 that are adjacent in the column direction are physically connected through the first connection wiring 323. The width of the first connection wiring 323 may be smaller than the width of the first touch electrodes 321.

The second touch electrodes 322 adjacent in the row direction in the first wiring layer 320 are physically separated.

The first wiring layer 320 may include a touch driving wiring 324 and a touch wiring pad TP. The touch driving wiring 324 is connected to the first touch electrodes 321 or to the second touch electrodes 322, and extends toward the pad side area TDR to form, or to connect to, the touch wiring pad TP at the pad side area TDR. The touch wiring pad TP may have a slightly more extended shape than the touch driving wiring 324 for connection with a touch printed circuit board 70, but is not limited thereto.

The first wiring layer 320 may be formed of a conductive material. For example, the first wiring layer 320 may be formed to include a transparent conductive oxide, such as indium tin oxide (ITO), indium zinc oxide (IZO), zinc oxide (ZnO), indium tin zinc oxide (ITZO), a metal material such as molybdenum, silver, titanium, copper, aluminum, or an alloy thereof, a conductive polymer such as PEDOT, metal nanowires, carbon nanotubes, graphene, and/or the like. When the first wiring layer 320 includes an opaque material, the first touch electrodes 321 and the second touch electrodes 322 may be formed in a mesh shape.

The first insulating layer 330 is on the first wiring layer 320. The first insulating layer 330 may be over substantially the entire surface of the substrate 310. The first insulating layer 330 may include contact holes 331 exposing the second touch electrodes 322.

The second wiring layer 340 is on the first insulating layer 330. The second wiring layer 340 includes a second connection wiring. The second connection wiring of the second wiring layer 340 electrically connects the neighboring second touch electrodes 322. The width of the second connection wiring of the second wiring layer 340 may be smaller than the width of the second touch electrodes 322. The second connection wiring of the second wiring layer 340 is electrically connected to the second touch electrodes 322 through the contact holes 331. Although it is illustrated that the neighboring second touch electrodes 322 are connected through one second connection wiring, they may be connected by a plurality of second connection wirings.

The second wiring layer 340 may be formed to include materials exemplified for the first wiring layer 320 described above. In one embodiment, the first wiring layer 320 including the first touch electrodes 321 and the second touch electrodes 322 having a relatively large area may be made of a transparent conductive oxide, and the second wiring layer 340 including the second connection wiring may be made of a metal material having a relatively low resistance such as molybdenum, silver, titanium, copper, aluminum, or an alloy thereof.

The second insulating layer 350 is on the second wiring layer 340. The second insulating layer 350 covers and protects the second wiring layer 340. The second insulating layer 350 may be over the entire surface of the substrate 310.

Each of the first insulating layer 330 and the second insulating layer 350 may have a single layer or a multilayer structure. Further, each of the first insulating layer 330 and the second insulating layer 350 may include an inorganic material, an organic material, or a composite material. In one embodiment, at least one of the first insulating layer 330 and the second insulating layer 350 may include an inorganic film. The inorganic film may include at least one of aluminum oxide, titanium oxide, silicon oxide, silicon oxynitride, zirconium oxide, and/or hafnium oxide.

In another embodiment, at least one of the first insulating layer 330 and the second insulating layer 350 may include an organic film. The organic film may include at least one of acrylic resin, methacrylic resin, polyisoprene, vinyl resin, epoxy resin, urethane resin, cellulose resin, siloxane resin, polyimide resin, polyamide resin and/or perylene resin.

The touch wiring pad TP may be exposed without being covered by the first insulating layer 330 and the second insulating layer 350. The touch printed circuit board 70 may be electrically connected to the exposed touch wiring pad TP. The touch printed circuit board 70 may be a flexible printed circuit board. An attachment portion CB located at one end of the touch printed circuit board 70 may be attached to the touch wiring pad TP of the touch panel 30 through an anisotropic conductive film ACF or the like. The touch printed circuit board 70 may be bent so as to externally surround the bent portion of the substrate 51 of the display panel 50 (e.g., on an outside edge) as shown in FIG. 2. The other end of the touch printed circuit board 70 may be electrically connected to the main circuit board 90.

Figure 8:
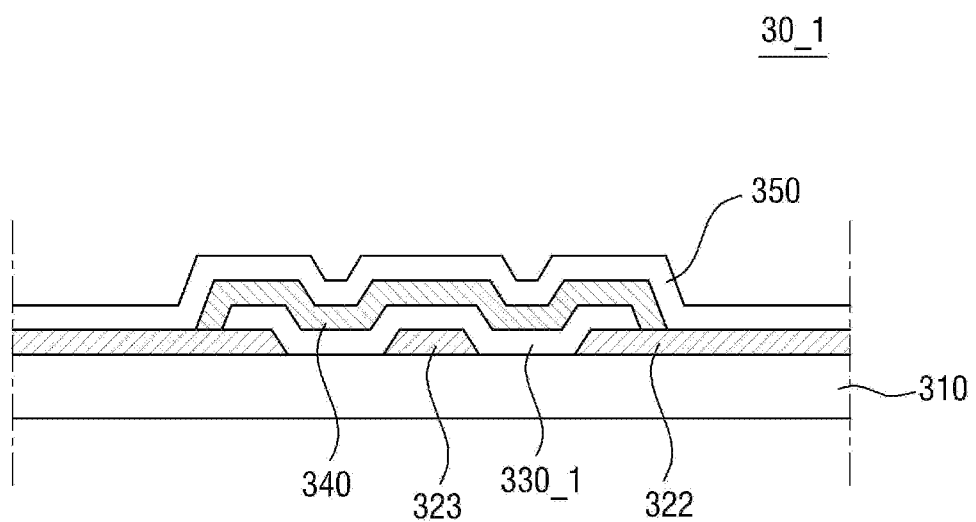
FIG. 8 is a cross-sectional view of a touch panel according to another embodiment.
Figure 9:
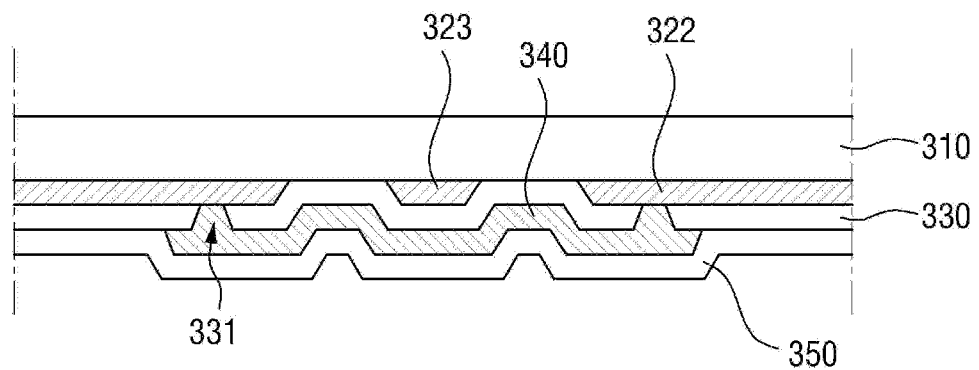
FIG. 9 is a cross-sectional view of a touch panel according to still another embodiment.

FIGS. 8 and 9 show modification examples of the touch panel described above.

FIG. 8 is a cross-sectional view of a touch panel according to another embodiment. Referring to FIG. 8, a touch panel 30_1 according to the present embodiment is different from the embodiment of FIG. 7 in that a first insulating layer 330_1 is not over the entire surface of the substrate 310. That is, the first insulating layer 330_1 is in an island shape at a portion where a second connection electrode of the second wiring layer 340 is formed. The first connection wiring 323 (see also FIG. 6) and the second connection electrode of the second wiring layer 340 are insulated from each other by the first insulating layer 330_1.

FIG. 9 is a cross-sectional view of a touch panel according to still another embodiment. A touch panel 30_2 according to the embodiment of FIG. 9 may be configured such that the stacking order of the substrate 310, the first wiring layer 320, the first insulating layer 330, the second wiring layer 340 and the second insulating layer 350 is opposite to that of the embodiment of FIG. 7.

Referring again to FIGS. 1 to 5, the window 10 is above the touch panel 30. The window 10 serves to cover and protect the touch panel 30 and/or the display panel 50. The window 10 completely overlaps the touch panel 30. The window 10 may be larger than the touch panel 30, and its edge may protrude from (e.g., extend beyond) each edge of the touch panel 30. Further, the window 10 may completely overlap the driving unit DDR as well as the display unit DAR of the display panel 50. The window 10 may be larger than the display panel 50, and its edge may protrude from (e.g., extend beyond) each edge of the display panel 50. The window 10 may cover up to the bent portion of the substrate 51 of the display panel 50.

The window 10 may be made of a transparent material. The window 10 may include, for example, glass or plastic. When the window 10 includes plastic, the window 10 may have a flexible property.

Examples of plastics applicable to the window 10 include, but are not limited to, polyimide, polyacrylate, polymethylmethacrylate (PMMA), polycarbonate, (PC), polyethylene naphthalate (PEN), polyvinylidene chloride, polyvinylidene difluoride (PVDF), polystyrene, ethylene vinylalcohol copolymer, polyethersulphone (PES), polyetherimide (PEI), polyphenylene sulfide (PPS), polyallylate, triacetyl cellulose (TAC), and/or cellulose acetate propionate (CAP). The plastic window 10 may be formed to include one or more of the plastic materials listed above.

When the window 10 includes plastic, it may further include a coating layer on the upper and lower surfaces of the plastic. In one embodiment, the coating layer may be a hard coating layer including an organic layer and/or an organic-inorganic hybrid layer including an acrylate compound and the like. The organic layer may include an acrylate compound. The organic-inorganic hybrid layer may be a layer in which an inorganic material such as silicon oxide, zirconium oxide, aluminum oxide, tantalum oxide, niobium oxide, and/or glass beads is dispersed in an organic material such as an acrylate compound. In another embodiment, the coating layer may include a metal oxide layer. The metal oxide layer may include, but is not limited to, a metal oxide such as titanium, aluminum, molybdenum, tantalum, copper, indium, tin and tungsten.

The first optically transparent adhesive member 20 is between the window 10 and the touch panel 30. The window 10 and the touch panel 30 may be coupled to each other by the first optically transparent adhesive member 20. The second optically transparent adhesive member 40 is between the touch panel 30 and the display panel 50. The touch panel 30 and the display panel 50 may be coupled to each other by the second optically transparent adhesive member 40.

Each of the first optically transparent adhesive member 20 and the second optically transparent adhesive member 40 may be made of an optically transparent adhesive film, an optically transparent adhesive tape, an optically transparent resin or the like.

Although the first optically transparent adhesive member 20 and the second optically transparent adhesive member 40 may be made of the same material, their properties may be different. For example, the first optically transparent adhesive member 20 may have a modulus that is smaller than that of the second optically transparent adhesive member 40.

The first optically transparent adhesive member 20 may be thinner than the second optically transparent adhesive member 40. For example, the thickness of the first optically transparent adhesive member 20 may be about 0.1 mm, and the thickness of the second optically transparent adhesive member 40 may be about 0.15 mm. However, a thickness relationship between the first optically transparent adhesive member 20 and the second optically transparent adhesive member 40 is not limited to the above example.

The first optically transparent adhesive member 20 and the second optically transparent adhesive member 40 have substantially similar shapes and sizes, but all edges thereof are not necessarily aligned with each other. That is, the first optically transparent adhesive member 20 and the second optically transparent adhesive member 40 may include a non-overlapping area in plan view. A detailed description thereof will be given later.

The display device 100 may further include a panel lower sheet 60. The panel lower sheet 60 may be attached to the back surface of the display unit DAR of the display panel 50. The panel lower sheet 60 includes at least one functional layer. The functional layer may be a layer that performs a heat dissipation function, an electromagnetic shielding function, a grounding function, a buffering function, a rigidity enhancing function, a supporting function, and/or a digitizing function. The functional layer may be a sheet layer, a film layer, a thin layer, a coating layer, a panel, a plate, or the like. One functional layer may be formed of a single layer, but may also be formed of a plurality of laminated thin films or coating layers. The functional layer may be, for example, a supporting substrate, a heat dissipation layer, an electromagnetic shielding layer, an impact absorbing layer, a digitizer, or the like.

The bent substrate 51 of the driving unit DDR of the display panel 50 and the display printed circuit board 80 and the main circuit board 90 connected thereto may be located below the panel lower sheet 60. The bent touch printed circuit board 70 may also be located below the panel lower sheet 60.

The lower surface of the panel lower sheet 60 may be bonded to the other surface of the bent substrate 51 and/or to the main circuit board 90 through an adhesive layer, but is not limited thereto.

Hereinafter, a positional relationship between the touch panel 30, the first optically transparent adhesive member 20, and the second optically transparent adhesive member 40 will be described in more detail.

The planar shape of the touch panel 30 may substantially correspond to the planar shape of the display unit DAR of the display panel 50, as shown in FIGS. 1 and 3. When the display unit DAR of the display panel 50 has a rectangular shape with rounded corners, the plane shape of the touch panel 30 may also have a substantially rectangular shape with rounded corners. However, the edge of a pad side area TDR, which is of the edge of the touch panel 30, might not have a straight line shape in plan view. For example, a planar profile of the pad side area TDR of the touch panel 30 may include a baseline, and a protrusion that protrudes outward from the baseline.

For example, the pad side area TDR of the touch panel 30 may include a connection area CNA at which the touch printed circuit board 70 is attached (e.g., to the touch panel 30), and a non-connection area NCA to which the touch printed circuit board 70 is not attached. A plurality of touch wiring pads TP are in the connection area CNA. In the present embodiment, the touch wiring pad TP is not located in the non-connection area NCA. In another embodiment, a dummy pad may be located in the non-connection area NCA, although the touch printed circuit board 70 is not directly attached thereto. The connection area CNA protrudes from the non-connection area NCA, thereby facilitating the attachment of the touch printed circuit board 70. At least a part of the touch wiring pads TP of the connection area CNA may be located on the outer side with respect to a side end portion in the non-connection area NCA. One end of an attachment portion CB of the touch printed circuit board 70 may be aligned with the side end portion of the non-connection area NCA, or may be located on the outer side thereof.

The remaining edges of the touch panel 30 (excluding the edge of the pad side area TDR) may have a substantially straight line shape in plan view. The remaining edges of the touch panel 30, other than the edge of the pad side area TDR may be aligned with the edges of the display panel 50, but are not limited thereto. The edge(s) of the display panel 50 may protrude more than the edge(s) of the touch panel 30, or the edge(s) of the touch panel 30 may protrude more than the edge(s) of the display panel 50.

The first optically transparent adhesive member 20 is on one surface of the touch panel 30, and the second optically transparent adhesive member 40 is on the other surface of the touch panel 30. The first optically transparent adhesive member 20 and the second optically transparent adhesive member 40 generally have a planar shape similar to that of the touch panel 30.

The edges of the first optically transparent adhesive member 20 and the second optically transparent adhesive member 40 may be located more inwardly than the edge of the touch panel 30. In other words, the edge of the touch panel 30 at a corresponding portion may protrude outwardly from the edge of the first optically transparent adhesive member 20 and from the edge of the second optically transparent adhesive member 40.

Thus, the edge of one surface of the touch panel 30 might not be covered by the first optically transparent adhesive member 20, and the edge of the other surface of the touch panel 30 might not be covered by the second optically transparent adhesive member 40. In this case where the first and second optically transparent adhesive members 20 and 40 are not completely formed up to the edge of the touch panel 30, the overflow of the adhesive material can be avoided in advance.

In the remaining side areas of the touch panel 30, except the pad side area TDR, the edges of the first optically transparent adhesive member 20 and the second optically transparent adhesive member 40 may have a straight line shape that is parallel to the respective edges of the touch panel 30. The first optically transparent adhesive member 20 and the second optically transparent adhesive member 40 may be the same planar shape in the side areas not including the pad side area TDR of the touch panel 30. The edges of the first optically transparent adhesive member 20 and the second optically transparent adhesive member 40 may be aligned with each other without protruding at the side areas not including the pad side area TDR.

Meanwhile, in the pad side area TDR of the touch panel 30, the first optically transparent adhesive member 20 may partially protrude outwardly from, or may extend further than, or may extend beyond, the second optically transparent adhesive member 40. At the non-connection area NCA of the touch panel 30, the edge of the first optically transparent adhesive member 20 and the edge of the second optically transparent adhesive member 40 (e.g., the side surfaces of the first and second optically transparent adhesive members 20 and 40 located at areas other than the pad side area TDR of the touch panel 30) are aligned with each other. On the other hand, at the connection area CNA of the touch panel 30, the edge of the touch panel 30 protrudes outwardly. Near the connection area CNA, the edge of the first optically transparent adhesive member 20 protrudes outwardly from the non-connection area NCA, while the edge of the second optically transparent adhesive member 40 is recessed inwardly. That is, the edge of the second optically transparent adhesive member 40 is recessed inwardly on the connection area CNA of the touch panel 30. Therefore, the edge of the first optically transparent adhesive member 20 protrudes outwardly from the edge of the second optically transparent adhesive member 40 on the connection area CNA such that the first optically transparent adhesive member 20 extends further toward the touch wiring pad TP than the second optically transparent adhesive member 40.

As shown in FIG. 2, the first optically transparent adhesive member 20, which protrudes convexly on the connection area CNA, may partially cover one surface of the touch printed circuit board 70 attached to the touch panel 30. The first optically transparent adhesive member 20 may be in contact with one surface of the touch printed circuit board 70. Therefore, it is possible to fill a space between the touch printed circuit board 70 and the window 10, and one surface of the touch printed circuit board 70 can be attached and fixed by the first optically transparent adhesive member 20. The attachment portion CB of the touch printed circuit board 70 may detach due to a tension caused by bending after the touch printed circuit board 70 is attached. The first optically transparent adhesive member 20 is located up to the attachment portion CB of the touch printed circuit board 70, thereby preventing or reducing the likelihood that the attachment portion CB will detach. Further, the display device 100 can be protected from an external impact by eliminating or reducing a separation space between the window 10 and the touch printed circuit board 70, and the flatness of the display device 100 can be improved by suppressing the movement of the window 10 and the touch printed circuit board 70.

As shown in FIG. 2, the second optically transparent adhesive member 40, which is recessed concavely at or near the connection area can, might not overlap the attachment portion CB of the touch printed circuit board 70 attached to the touch panel 30. In other words, the other surface of the touch panel 30 in the connection area CNA of the touch printed circuit board 70 may be exposed without being covered by the second optically transparent adhesive member 40. The other surface of the touch panel 30 on the connection area CNA of the touch printed circuit board 70 may be separated from the display panel 50 located therebelow, an there may be an empty space therebetween. Therefore, a space suitable for an attachment process of the touch printed circuit board 70 can be secured. Even if an external force is received, or even if wrinkles are generated by the attachment portion CB of the touch printed circuit board 70, because the touch printed circuit board 70 is not directly coupled with the display panel 50 located therebelow, it is possible to reduce or prevent a deformation force, such as an external force or wrinkles, from being transmitted to the display panel 50.

Meanwhile, on the non-connection area NCA, the first optically transparent adhesive member 20 and the second optically transparent adhesive member 40 sufficiently protrude (e.g., up to a margin space to prevent or reduce the likelihood of the overflow of the adhesive material). Accordingly, a stepped space can be reduced or minimized to disperse an external impact, and the flatness of the display device 100 can be improved.

In the above embodiment, the case where the second optically transparent adhesive member 40 is concavely recessed from the connection area CNA has been exemplified. However, if a space suitable for an attachment process of the touch printed circuit board 70 can be secured in the non-connection area NCA, the second optically transparent adhesive member 40 does not necessarily have to be recessed. That is, the edge of the second optically transparent adhesive member 40 may form a straight line without being differently protruded or recessed with respect to the non-connection area NCA and the connection area CNA, or may protrude further toward or into the connection area CNA. However, in such an embodiment, the second optically transparent adhesive member 40 may be located relatively inward with respect to the edge of the first optically transparent adhesive member 20.

Hereinafter, other embodiments will be described.

Figure 10:
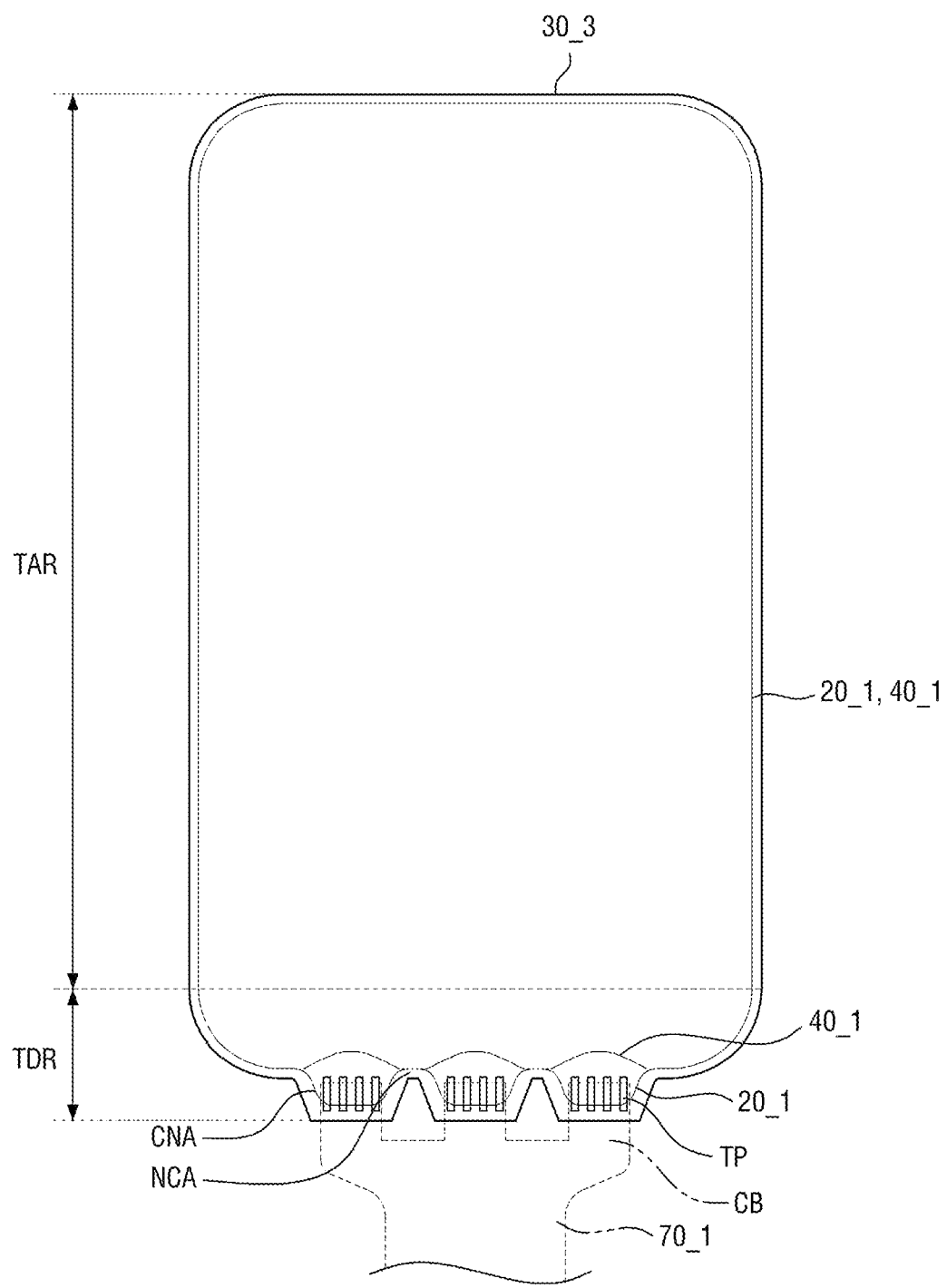
FIG. 10 is a layout diagram showing a planar arrangement relationship between a touch panel and first and second optically transparent adhesive members according to another embodiment.

FIG. 10 is a layout diagram showing a planar arrangement relationship between a touch panel and first and second optically transparent adhesive members according to another embodiment.

Referring to FIG. 10, a touch panel 30_3 according to the present embodiment differs from the embodiment of FIG. 3 in that it includes a plurality of connection areas CNA.

For example, the pad side area TDR of the touch panel 30_3 includes a plurality of connection areas CNA. A non-connection area NCA is between, or separates, the connection areas CNA. The connection areas CNA and the non-connection areas NCA may be alternately arranged. Each connection area CNA protrudes more than each non-connection area NCA. An attachment portion CB of a touch printed circuit board 70_1 is formed to correspond to each connection area CNA. For example, when the connection area CNA is divided into three parts, the attachment part CB of the touch printed circuit board 70_1 may be divided into three corresponding parts.

Also in the case of the present embodiment, the edge of the first optically transparent adhesive member 20_1 protrudes convexly on the connection area CNA while the edge of the second optically transparent adhesive member 40_1 is recessed concavely on, or from, the connection area CNA. The edge of the first optically transparent adhesive member 20_1 and the edge of the second optically transparent adhesive member 40_1 are aligned on the non-connection area NCA between the connection areas CNA. A relative positional relationship between the edge of the first optically transparent adhesive member 20_1 and the edge of the second optically transparent adhesive member 40_1 in a plan view includes repeated protrusions and alignments. That is, a region where the first optically transparent adhesive member 20_1 protrudes further than the second optically transparent adhesive member 40_1, and a region where the first optically transparent adhesive member 20_1 and the second optically transparent adhesive member 40_1 are aligned, are alternately arranged.

Therefore, the space suitable for the attachment process of the touch printed circuit board 70_1 can be ensured while suppressing the movement of the touch printed circuit board 70_1 and while improving the flatness. It is also possible to reduce or prevent wrinkles or other deformation force from being transmitted toward the display panel 50 of the back surface of the attachment portion CB.

Figure 11:
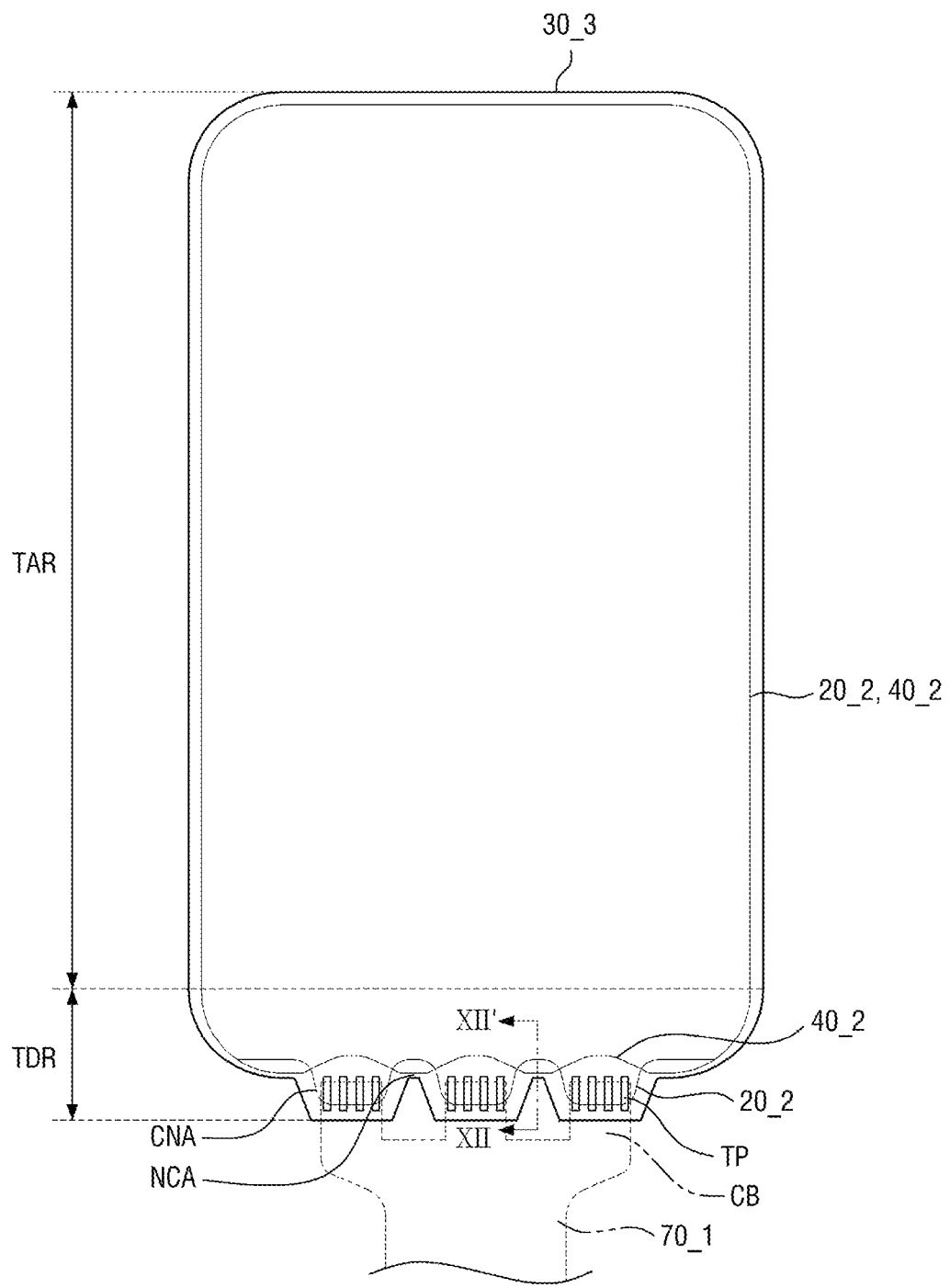
FIG. 11 is a layout diagram showing a planar arrangement relationship between a touch panel and first and second optically transparent adhesive members according to still another embodiment.
Figure 12:
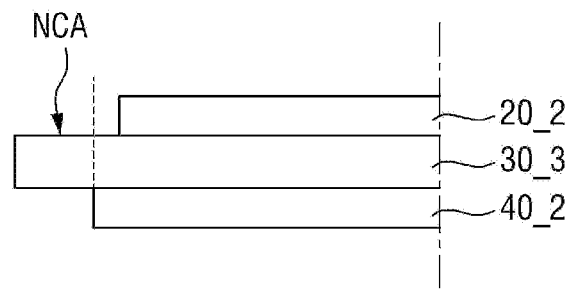
FIG. 12 is a cross-sectional view taken along the line XII-XII' of FIG. 11.

FIG. 11 is a layout diagram showing a planar arrangement relationship between a touch panel and first and second optically transparent adhesive members according to still another embodiment. FIG. 12 is a cross-sectional view taken along the line XII-XII' of FIG. 11.

Referring to FIGS. 11 and 12, the present embodiment differs from the embodiment of FIG. 10 with respect to the positional relationship between the edge of a first optically transparent adhesive member 20_2 and the edge of a second optically transparent adhesive member 40_2.

For example, the present embodiment is similar to the embodiment of FIG. 10 in that the edge of the first optically transparent adhesive member 20_2 protrudes from, or extends further than, the edge of the second optically transparent adhesive member 40_2 on the connection area CNA of the pad side area TDR of a touch panel 30_3. However, on the non-connection area NCA, the edge of the second optically transparent adhesive member 40_2 protrudes more than the edge of the first optically transparent adhesive member 20_2 (e.g., extends outwardly further than the side of the first optically transparent adhesive member 20_2). A relative positional relationship between the edge of the first optically transparent adhesive member 20_2 and the edge of the second optically transparent adhesive member 40_2 in plan view includes repeated protrusions and recessions. That is, a region where the first optically transparent adhesive member 20_2 protrudes further, and a region where the second optically transparent adhesive member 40_2 protrudes further, are alternately arranged.

In the case of the present embodiment, because the second optically transparent adhesive member 40_2 is relatively further protruded on the non-connection area NCA, the bonding force with the display panel 50 therebelow is increased. Accordingly, the space suitable for the attachment process of the touch printed circuit board 70_1 can be ensured while improving the flatness of the display device 100. It is also possible to reduce or prevent wrinkles or other deformation force from being transmitted toward the display panel 50 of the back surface of the attachment portion CB.

Figure 13:
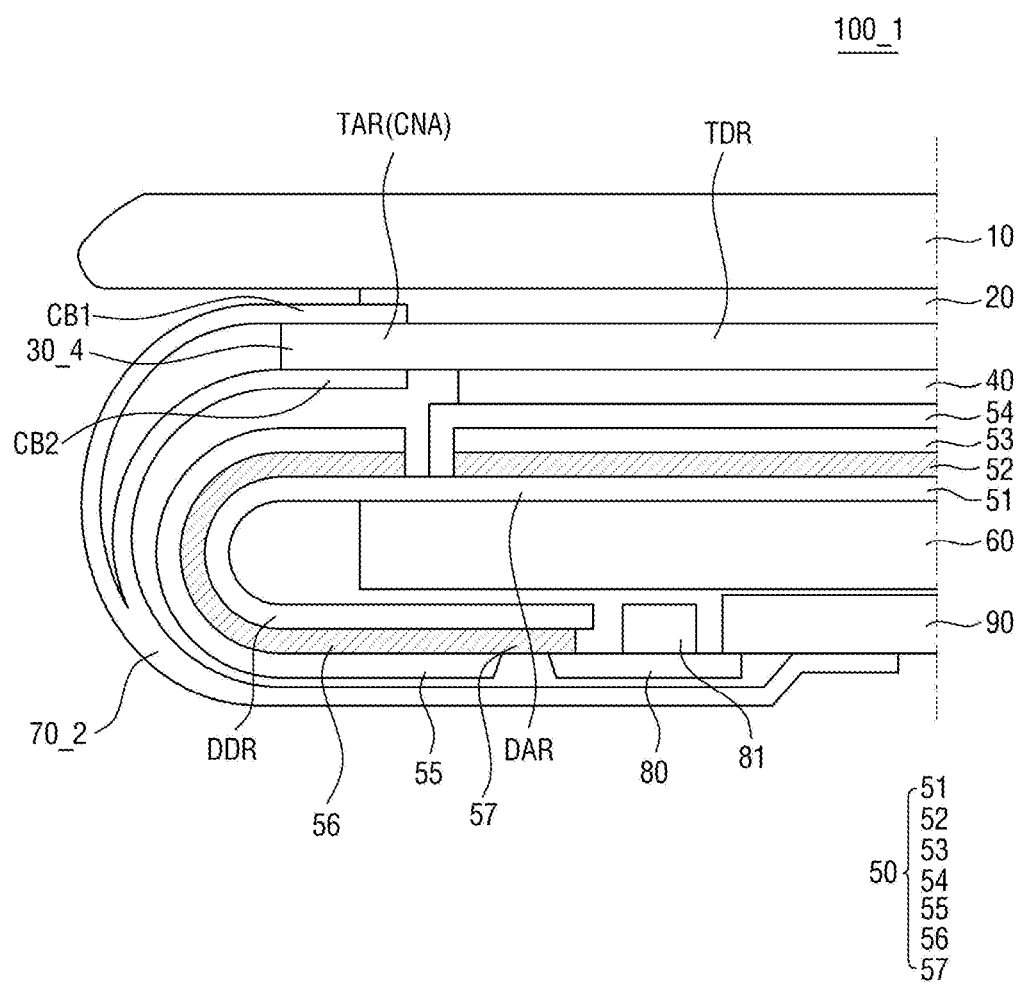
FIG. 13 is a cross-sectional view of a display device according to still another embodiment.
Figure 14:
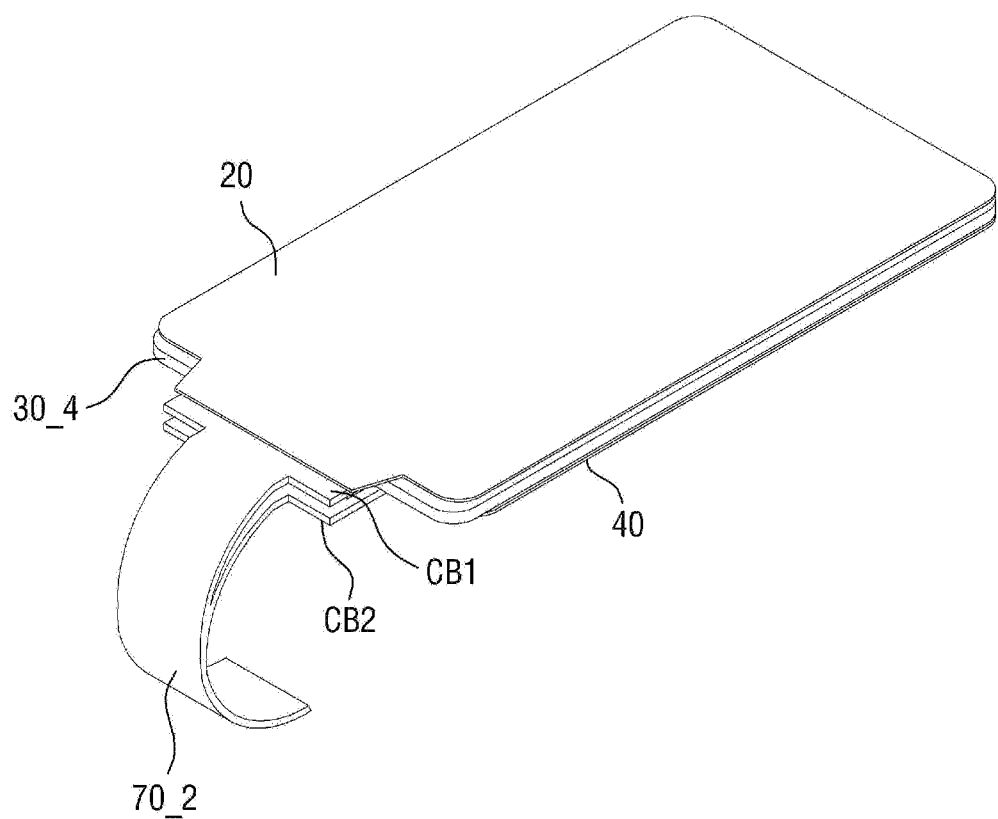
FIG. 14 is a perspective view of the touch panel, the first and second optically transparent adhesive members and the touch printed circuit board of FIG. 13.
Figure 15:
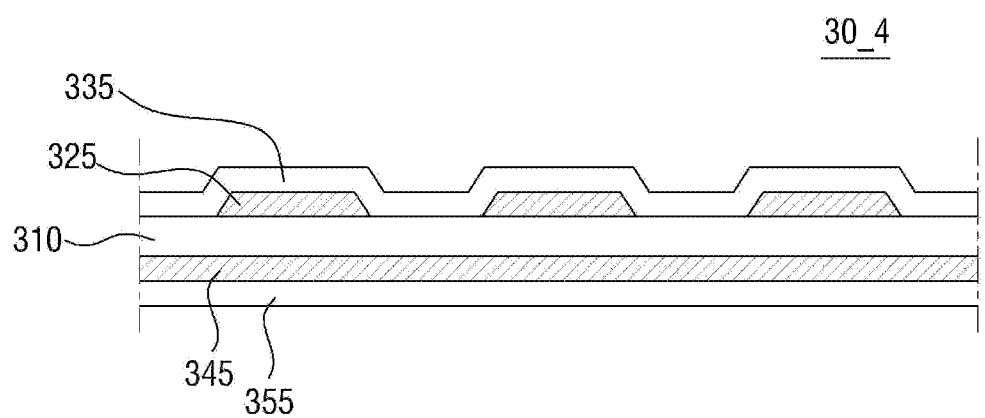
FIG. 15 is a cross-sectional view of the touch panel of FIG. 14.

FIG. 13 is a cross-sectional view of a display device according to still another embodiment. FIG. 14 is a perspective view of the touch panel, the first and second optically transparent adhesive members, and the touch printed circuit board. FIG. 15 is a cross-sectional view of the touch panel of FIG. 14.

Referring to FIGS. 13 to 15, a display device 100_1 according to the present embodiment differs from the embodiment of FIGS. 1 to 5 in that a touch printed circuit board 70_2 is attached not only to one surface, but is also attached to the other surface of a touch panel 30_4. This attachment can be achieved when the touch wiring pads TP of the touch panel 30_4 are formed on both the one surface and the other surface. An exemplary structure of the touch panel 30_4 is shown in FIG. 15.

Referring to FIG. 15, the touch panel 30_4 may include a substrate 310, a first wiring layer 325 on one surface of the substrate 310, a first insulating layer 335 covering the first wiring layer 325, a second wiring layer 345 on the other surface of the substrate 310 and a second insulating layer 355 covering the second wiring layer 345.

The first wiring layer 325 and the second wiring layer 345 are insulated from each other by the substrate 310. The first wiring layer 325 includes a first touch wiring. The second wiring layer 345 includes a second touch wiring. The first touch wiring may extend in the column direction (long side direction) and the second touch wiring may extend in the row direction (short side direction), or vice versa, although the present disclosure is not limited thereto. A region where the first touch wiring and the second touch wiring cross each other becomes a touch electrode region.

The first wiring layer 320 further includes a first touch wiring pad connected to the first touch wiring, and the second wiring layer 340 further includes a second touch wiring pad TP connected to the second touch wiring. The first touch wiring pad and the second touch wiring pad are located at the pad side area TDR of the touch panel 30_4 as shown in FIGS. 13 and 14, respectively.

The touch printed circuit board 70_2 includes a first attachment portion CB1 attached to the first touch wiring pad and a second attachment portion CB2 attached to the second touch wiring pad. The first attachment portion CB1 and the second attachment portion CB2 may be connected and integrated. The end of the first attachment portion CB1 and the end of the second attachment portion CB2 may be aligned on the touch panel 30_4, but the present disclosure is not limited thereto.

This embodiment is also similar to the embodiment of FIG. 2 in that the edge of the first optically transparent adhesive member 20 convexly protrudes on the connection area CNA while the edge of the second optically transparent adhesive member 40 is concavely recessed on the connection area CNA, and the edge of the first optically transparent adhesive member 20 and the edge of the second optically transparent adhesive member 40 are aligned at the non-connection area NCA between the connection areas CNA. A relative positional relationship between the edge of the first optically transparent adhesive member 20 and the edge of the second optically transparent adhesive member 40 in plan view includes repeated protrusions and alignments.

On the connection area CNA, the first optically transparent adhesive member 20 partially overlaps the first attachment portion CB1 of the touch printed circuit board 70_2. That is, similarly to the embodiment of FIG. 2, the first optically transparent adhesive member 20 may partially cover one surface of the first attachment portion CB1 of the touch printed circuit board 70_2, and may fix it to the window 10. Therefore, the movement of the touch printed circuit board 70_2 can be suppressed, and the flatness of the display device 100 can be improved.

On the other hand, on the connection area CNA, the second optically transparent adhesive member 40 does not overlap the second attachment portion CB2 of the touch printed circuit board 70_2. The edge of the second optically transparent adhesive member 40 may be spaced apart from the end of the second attachment portion CB2 of the attached touch printed circuit board 70_2. Thus, an attachment space of the second attachment portion CB2 of the touch printed circuit board 70_2 can be secured.

Figure 16:
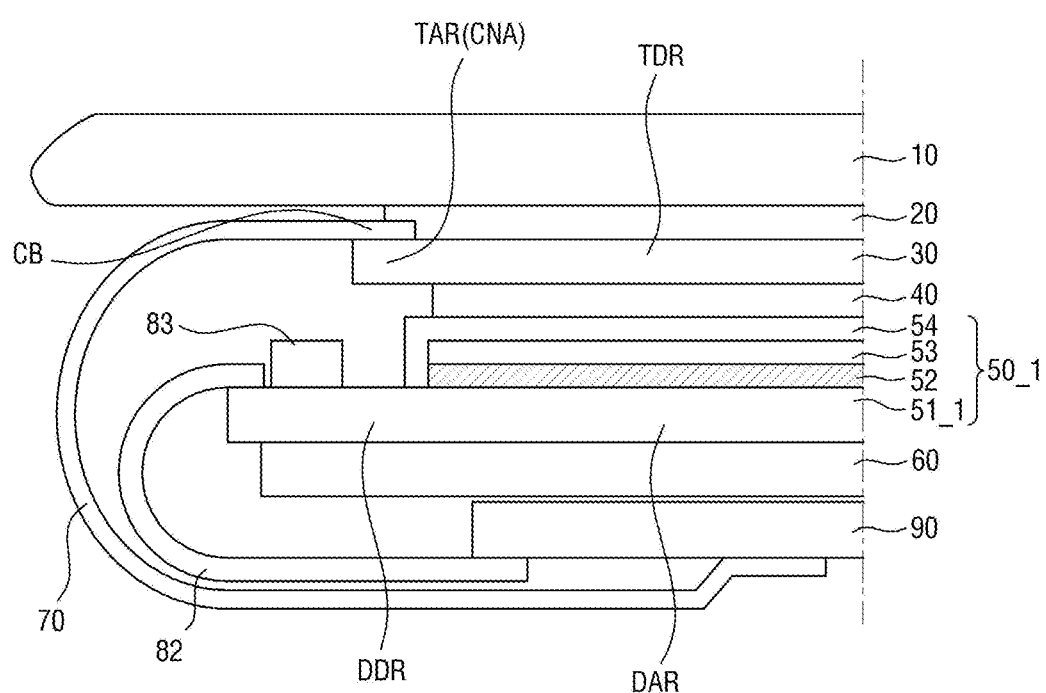
FIG. 16 is a cross-sectional view of a display device according to still another embodiment.

FIG. 16 is a cross-sectional view of a display device according to still another embodiment.

Referring to FIG. 16, a display device 100_2 according to the present embodiment is different from the embodiment of FIG. 2 in that a display panel 50_1 is flat without being bent.

For example, the driving unit DDR of the display panel 50_1 may extend outward, and may maintain the same flatness as the display unit DAR. A substrate 51_1 of the display panel 50_1 may be a rigid substrate, such as glass.

However, the present disclosure is not limited thereto, and the display panel 50_1 may be made of a flexible plastic material, such as polyimide, and may maintain the flatness without being bent in the driving unit DDR.

A driving chip 83 may be mounted on the driving unit DDR of the display panel 50_1. The mounting position of the driving chip 83 is located more outwardly than the edge of the second optically transparent adhesive member 40. Further, the mounting position of the driving chip 83 may be located more outwardly than the edge of the first optically transparent adhesive member 20 and the edge of the touch panel 30, although the present embodiment is not limited thereto.

A display printed circuit board 82 may be attached to the outside of the driving chip 83. The display printed circuit board 82 may be attached to one surface of the display panel 50 via an anisotropic conductive film (ACF) or the like. One end of the display printed circuit board 82 attached to the display panel 50_1 may be located more outwardly than not only the edge of the second optically transparent adhesive member 40, but also the edge of the first optically transparent adhesive member 20 and the edge of the touch panel 30.

The display printed circuit board 82 may be a flexible printed circuit board similarly to the touch printed circuit board 70. The display printed circuit board 82 may be bent to surround the edge of the display panel 50_1 from the outside, as shown in FIG. 16. The other end of the display printed circuit board 82 may be electrically connected to the main circuit board 90. The touch printed circuit board 70 may be bent to surround, or partially surround, the display printed circuit board 82 from the outside.

Also in this embodiment, the edge of the first optically transparent adhesive member 20 protrudes convexly at the connection area CNA, while the edge of the second optically transparent adhesive member 40 is concavely recessed at the connection area CNA, and the edge of the first optically transparent adhesive member 20 and the edge of the second optically transparent adhesive member 40 are aligned at the non-connection area NCA between the connection areas CNA. A relative positional relationship between the edge of the first optically transparent adhesive member 20 and the edge of the second optically transparent adhesive member 40 in a plan view includes repeated protrusions and alignments.

Therefore, because the second optically transparent adhesive member 40 is relatively further protruded on the non-connection area NCA, the bonding force with the display panel 50_1 therebelow is increased in the non-connection area NCA. Accordingly, the space suitable for the attachment process of the touch printed circuit board 70 can be ensured while improving the flatness of the display device 100_2. It is also possible to reduce or prevent wrinkles or other deformation force from being transmitted toward the display panel 50_1 of the back surface of the attachment portion CB.

In concluding the detailed description, those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

What is claimed is:

1. A display device comprising: a first panel comprising a pad side area at one side of the first panel; a first optically transparent adhesive member on a first surface of the first panel; a printed circuit board comprising a first attachment portion and a second attachment portion attached to the first panel at the pad side area, the first attachment portion and the second attachment portion being spaced apart from each other; and a second optically transparent adhesive member on a second surface of the first panel, wherein the pad side area includes: a first connection area at which the first attachment portion of the printed circuit board is attached to the first panel, a second connection area at which the second attachment portion of the printed circuit board is attached to the first panel, and a non-connection area at which the printed circuit board is not attached to the first panel, wherein the non-connection area is between the first connection area and the second connection area, wherein an outer edge of the first panel at the first connection area and an outer edge of the first panel at the second connection area protrude more outwardly than an outer edge of the first panel at the nonconnection area, and wherein the first optically transparent adhesive member comprises a first convex portion overlapping the first connection area, a second convex portion overlapping the second connection area, and a concave portion between the first and second convex portions, the first and second convex portions being convex in a plan view.

2. The display device of claim 1, wherein the first optically transparent adhesive member overlaps the first attachment portion of the printed circuit board and the second attachment portion of the printed circuit board.

3. The display device of claim 2, wherein the second optically transparent adhesive member does not overlap the first attachment portion of the printed circuit board or the second attachment portion of the printed circuit board.

4. The display device of claim 3, wherein the first panel further comprises a sensing area, and
wherein the first optically transparent adhesive member and the second optically transparent adhesive member overlap the sensing area of the first panel.

5. The display device of claim 1, wherein a perimeter of the first panel fully surrounds a perimeter of the first optically transparent adhesive member in a plan view.

6. The display device of claim 1, wherein a portion of a perimeter of the first optically transparent adhesive member protrudes more outwardly than a perimeter of the second optically transparent adhesive member in a plan view.

7. The display device of claim 1, wherein an occupied area of the first optically transparent adhesive member is larger than an occupied area of the second optically transparent adhesive member in a plan view.

8. The display device of claim 1, wherein an edge of the first optically transparent adhesive member and an edge of the second optically transparent adhesive member are aligned to directly overlap each other in a plan view at the non-connection area, and
wherein the edge of the first optically transparent adhesive member protrudes more outwardly than the edge of the second optically transparent adhesive member in a plan view at the first connection area and the second connection area.

9. The display device of claim 1, further comprising:
a window on the first optically transparent adhesive member; and
a second panel on the second optically transparent adhesive member opposite the first panel.

10. The display device of claim 9, wherein the first panel comprises a touch panel, and wherein the second panel comprises a display panel.

11. A display device comprising: a first panel comprising a first pad portion, a second pad portion, and a portion between the first pad portion and the second pad portion; a first adhesive on a first surface of the first panel; a printed circuit board comprising a first portion attached to the first pad portion and a second portion attached to the second pad portion, the first portion and the second portion being spaced apart from each other; and a second adhesive on a second surface of the first panel, wherein the first pad portion and the second pad portion are spaced apart from each other in a first direction, wherein the first pad portion and the second pad portion protrude more outwardly than the portion of the first panel in a second direction intersecting the first direction, wherein an outer edge of the first panel at the first pad portion and an outer edge of the first panel at the second pad portion protrude more outwardly than an outer edge of the first panel between the first and second pad portion, and wherein the first adhesive comprises a first convex portion overlapping the first pad portion, a second convex portion overlapping the second pad portion, and a concave portion between the first and second convex portions, the first and second convex portions being convex in a plan view.

12. The display device of claim 11, wherein each of the first pad portion and the second pad portion includes a plurality of pads, and
wherein the portion of the first panel does not include any pad.

13. The display device of claim 11, wherein the first adhesive overlaps the first portion of the printed circuit board and the second portion of the printed circuit board.

14. The display device of claim 13, wherein the second adhesive does not overlap the first portion of the printed circuit board or the second portion of the printed circuit board.

15. The display device of claim 14, wherein the first panel further comprises a sensing area, and
wherein the first adhesive and the second adhesive overlap the sensing area of the first panel.

16. The display device of claim 11, wherein a perimeter of the first panel fully surrounds a perimeter of the first adhesive in a plan view.

17. The display device of claim 11, wherein a portion of a perimeter of the first adhesive protrudes more outwardly than a perimeter of the second adhesive in a plan view.

18. The display device of claim 11, further comprising:
a window on the first adhesive; and
a second panel on the second adhesive opposite the first panel.

19. The display device of claim 18, wherein the first panel comprises a touch panel, and
wherein the second panel comprises a display panel.

* * * * *